(12) United States Patent
Liu (10) Patent No.: US 8,951,833 B2
(45) Date of Patent: Feb. 10, 2015

(54) DEFECT FREE DEEP TRENCH METHOD FOR SEMICONDUCTOR CHIP

(75) Inventor: Kun-Yi Liu, Vancouver, WA (US)

(73) Assignee: WaferTech, LLC, Camas, WA (US)

( * ) Notice: Subject to any disclaimer, the term of this patent is extended or adjusted under 35 U.S.C. 154(b) by 708 days.

(21) Appl. No.: 13/162,873

(22) Filed: Jun. 17, 2011

(65) Prior Publication Data

US 2012/0322259 A1   Dec. 20, 2012

(51) Int. Cl.
| | | |
|---|---|---|
| H01L 21/00 | (2006.01) | |
| H01L 21/311 | (2006.01) | |
| B81C 1/00 | (2006.01) | |
| H01L 23/58 | (2006.01) | |
| H01L 21/28 | (2006.01) | |
| H01L 21/50 | (2006.01) | |
| H01L 21/304 | (2006.01) | |

(52) U.S. Cl.
CPC ......... B81C 1/00063 (2013.01); *H01L 2924/14* (2013.01); *H01L 2924/1433* (2013.01); *H01L 2924/1461* (2013.01); H01L 23/585 (2013.01); *B81B 2207/012* (2013.01); *H01L 2924/0002* (2013.01)

USPC ................... 438/106; 438/701; 257/E21.158; 257/E21.238; 257/E21.249; 257/E21.499

(58) Field of Classification Search
None
See application file for complete search history.

(56) References Cited

U.S. PATENT DOCUMENTS

2010/0297841 A1*  11/2010  Thomas et al. ............... 438/614
2012/0018895 A1*   1/2012  Oganesian et al. ........... 257/773
2012/0241914 A1*   9/2012  Yook et al. ................... 257/620

* cited by examiner

*Primary Examiner* — Calvin Choi
(74) *Attorney, Agent, or Firm* — Duane Morris LLP (57) ABSTRACT

A method for forming large substantially defect-free void areas on a semiconductor integrated circuit chip includes processing the chip through the passivation level processing operations then forming one or more openings in a designated blank area of the integrated circuit chip in a separate dedicated etching operation. The one or more openings may constitute 5-10% or more of the total area of the semiconductor chip. The void areas are deep trench openings that extend through the passivation layer and through all of the other material layers in the blank area exposing the substrate surface in one embodiment and through all material layers except for a field oxide layer formed directly on the substrate in another embodiment.

19 Claims, 8 Drawing Sheets

DEFECT FREE DEEP TRENCH METHOD FOR SEMICONDUCTOR CHIP

TECHNICAL FIELD

The disclosure relates to methods for manufacturing semiconductor product chip that include a relatively large void area that extends to the substrate surface.

BACKGROUND

In today's electronics industry, advanced semiconductor chip design and assembly techniques allow for increased levels of integration and the production of more compact electronic devices. For example, dual packages are utilized that include different types of semiconductor devices within the same package. One example may be an ASIC (application specific integrated circuit) product chip that may be used in a dual package with a MEMS (microelectromechanical) part. Other advantageous packaging techniques may utilize MEMS parts in combination with one or more other product chips within a package. The increased integration levels in packaging may utilize bonding techniques other than conventional wire bonding or soldering. One such technique involves the bonding of an ASIC product chip within a package by directly joining the ASIC product chip to another device such as a MEMS device.

Some of the new techniques for packaging semiconductor chips and/or coupling semiconductor chips to other components benefit from having non-conventional structures on the semiconductor chip. These unconventional structures enable the advances in packaging integration, but there are typically challenges associated with producing the non-conventional structures using conventional semiconductor processing methods due to the limitations in the conventional semiconductor processing methods. In particular, it is challenging to produce defect-free non-conventional structures using processing methods developed to produce conventional structures.

The disclosure addresses the limitations in the chip structures available for such non-conventional bonding due to the shortcomings and limitations associated with the processing techniques used to manufacture semiconductor chips.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

The disclosure provides a method for forming one or more deep trench openings on a semiconductor chip. The deep trench opening extends from the uppermost, passivation layer used in the semiconductor chip to the substrate surface itself according to one embodiment. The deep trench opening or openings include a significantly high area and the area may represent an area that may be about 10% of the area of the entire semiconductor chip, according to one exemplary embodiment. According to various exemplary embodiments, the deep trench opening may be rectangular in shape, circular in shape, oblong in shape, ovoid in shape, trapezoidal in shape or it may take on various other suitable shapes. According to one exemplary embodiment, a blank area of the semiconductor chip is identified and one or a plurality of deep trench openings area formed in the blank area. The plurality of deep trench openings may be formed in an array in the blank area. According to one exemplary embodiment, the array of openings may be separated by dummy features in the blank area.

According to various exemplary embodiments, the deep trench opening or openings may be formed after the passivation layer has been formed and patterned, i.e. after the passivation etching process has been used to create openings through the passivation layer only, such openings extending down to a subjacent conductive feature such as a bond pad. According to one exemplary embodiment, the passivation layer patterning and etching prior to the deep trench formation may include etching the passivation layer only in areas other than the blank area in which the passivation layer remains intact. According to various exemplary embodiments, the portion of the blank area in which the deep trench openings are to be formed, may consist only of a stack of several dielectric materials, and according to another exemplary embodiment, the blank area in which the opening or openings are to be formed may consist of a plurality of several dielectric layers formed over a polysilicon layer formed over a field oxide layer.

Figure 1:
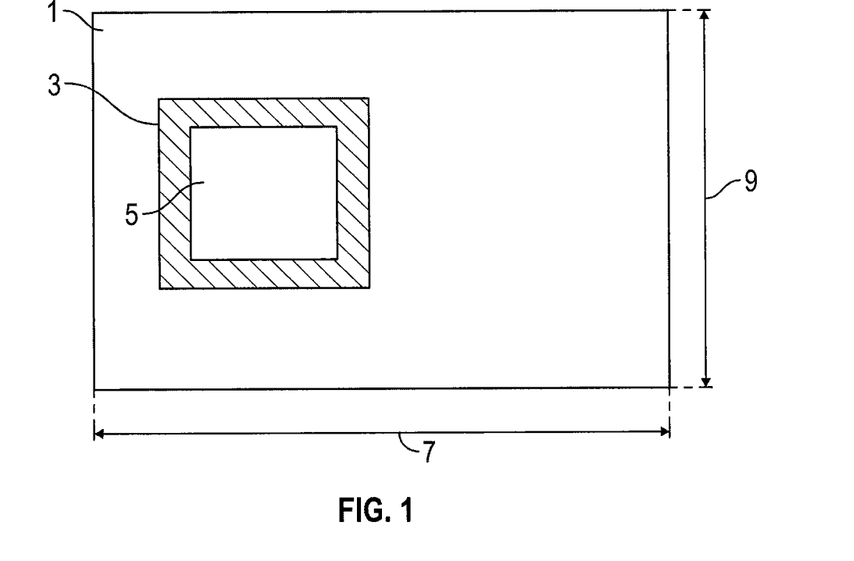
FIG. 1 is a plan view showing an exemplary layout of a deep trench structure formed according to a method of the disclosure.

FIG. 1 is a plan view showing an exemplary semiconductor chip 1. Semiconductor chip 1 may be an ASIC chip or any of various other integrated circuit devices and is alternatively referred to as a die. Semiconductor chip 1 includes various active devices, other semiconductor structures and interconnect structures in areas other than blank area 3. Blank area 3 including exemplary deep trench opening 5 is included on semiconductor chip 1. Semiconductor chip 1 has an area determined by length 7 and width 9. According to one exemplary embodiment, width 7 may range from about 1-2 millimeters and width 9 may range from about 0.8 to 1.4 millimeters. According to one exemplary embodiment, deep trench opening 5 may be a square with dimensions of 300 microns× 300 microns and may include an area that is about 10% of the total area of semiconductor chip 1 as defined by length 7 and width 9. In other exemplary embodiments, deep trench opening 5 may take on other shapes such as but not limited to rectangular, oblong, ovoid, circular, or trapezoidal in shape.

Figure 2:
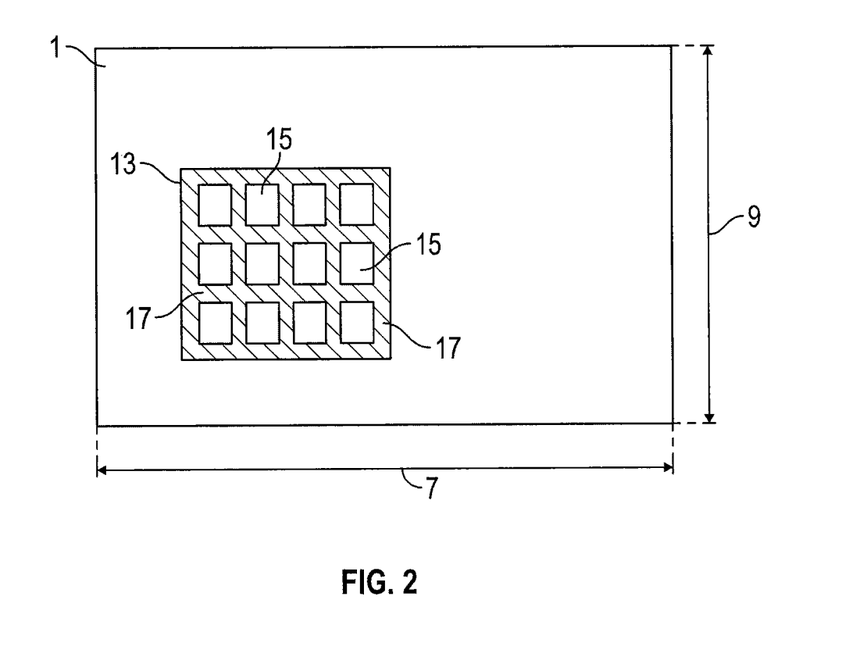
FIG. 2 is a plan view showing another exemplary layout of a deep trench structure formed according to a method of the disclosure.

FIG. 2 shows another exemplary semiconductor chip 1 having an area defined by width 7 and length 9 and includes another exemplary blank area 13. Blank area 13 includes an array of discrete deep trench openings 15 separated by dummy area 17. Deep trench openings 15 may be square, rectangular, oblong, ovoid, circular or trapezoidal in shape or they may take on other shapes in other exemplary embodiments. The deep trench openings that form the array, may be of different sizes and shapes.

The area of each deep trench opening 5 or 15 is determined by its shape and its lateral dimensions which may range from about 20 microns to about 400 microns in various exemplary embodiments. According to one exemplary embodiment, the area of deep trench opening 5 shown in FIG. 1 or the aggregate area of the deep trench openings 15 shown in FIG. 2 may be at least 5% of the total area of semiconductor chip 1 as defined by length 7 and width 9 and in one exemplary embodiment the aggregate area may be about 10% of the total area of semiconductor chip 1.

Figure 3:
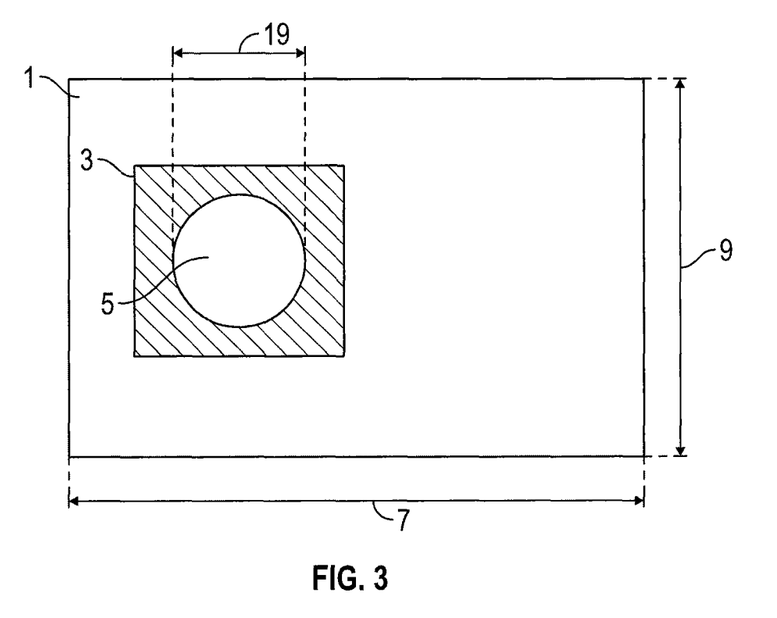
FIG. 3 is a plan view showing yet another exemplary layout of a deep trench structure formed according to a method of the disclosure.

FIG. 3 is a plan view showing yet another exemplary plan view of a deep trench opening formed according to the method of the disclosure. Semiconductor chip 1 includes blank area 3 with circular deep trench opening 5. Deep trench opening 5 includes an area defined by diameter 19 which may range from about 100 microns to about 300 microns in various exemplary embodiments and may be about 200 microns according to one exemplary embodiment.

Figure 4A:
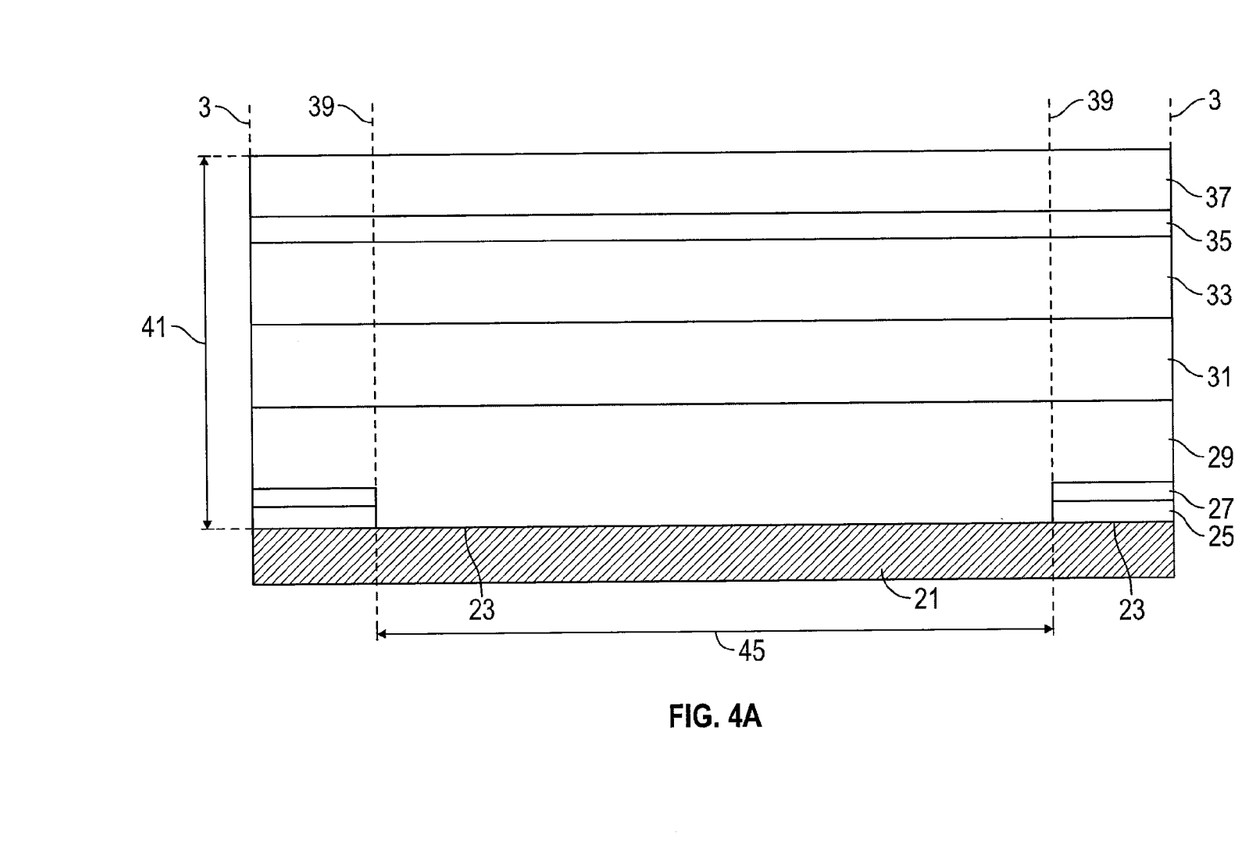
FIGS. 4A-4B are cross-sectional views showing an exemplary sequence of processing operations according to the disclosure.

FIG. 4A shows semiconductor substrate 21 and illustrates an embodiment in which a deep trench opening will be formed in region 39 within blank area 3 such as previously shown in FIGS. 1-3. According to one exemplary embodiment, substrate 21 with substrate surface 23 may be a silicon substrate, but according to other exemplary embodiments, substrate 21 may be a gallium arsenide substrate, a silicon germanium substrate, or any of various SOI (silicon-on-insulator) or other substrates such as used in the semiconductor manufacturing industry.

The exemplary film structure shown in FIG. 4A includes first polysilicon layer 25 and second polysilicon layer 27 which are formed within blank region 3 but do not extend into region 39. These films may be formed and utilized for active device features throughout the other areas of the semiconductor chip and patterned during the patterning operations used to form semiconductor structures in other portions of semiconductor chip 1. The other films illustrated in FIG. 4A may represent dielectric films also used throughout semiconductor chip 1 and according to one exemplary embodiment, the film stack within region 39 may represent all of the dielectric materials used in semiconductor chip 1.

According to one exemplary embodiment, dielectric layer 29 may be an ILD (inter level dielectric) used throughout semiconductor chip 1, dielectric film 31 may be a first inter-metal dielectric (IMD1), dielectric layer 33 may be a second inter-metal dielectric (IMD2) and dielectric layer 35 may be a passivation SOG (spin on glass) layer. The film stack is intended to be exemplary only and in other exemplary embodiments, more or fewer films may be used. Each of the films may be formed of various suitable dielectric materials that may be formed using conventional or other means. Passivation layer 37 is the uppermost layer and various suitable passivation materials such as nitrides or oxynitrides may be used for passivation layer 37. It can be seen that dielectric layer 29 extends to substrate surface 23 in region 39 where first and second polysilicon layers 25, 27 are absent. Film stack thickness 41 may range from about 7 to 9 microns in various exemplary embodiments, but according to other exemplary embodiments, other suitable thicknesses may be utilized depending on the device being formed and the number and thicknesses of the individual films. Width 45 of region 39 may range from about 20 microns to about 400 microns and may depend upon the geometrical shape of region 39 that defines the deep trench opening, as well as the number of deep trench openings being formed in a given blank region. Region 39 of FIG. 4A may represent a single deep trench opening to be formed in blank region 3 (as in FIGS. 1 and 3) or one of several deep trench openings to be formed in blank region 3 (as in FIG. 2). The structure illustrated in FIG. 4A represents blank area 3 portion of semiconductor chip 1 after semiconductor chip 1 has been processed through passivation layer processing operations such as the formation, patterning and etching of passivation layer 37. As such, in some other areas of semiconductor chip 1, passivation layer 37 has been removed by an etching operation to expose a subjacent feature such as a bond pad.

A photoresist layer is then formed over passivation layer 37 and patterned such that it is removed from region 39.

Figure 4B:
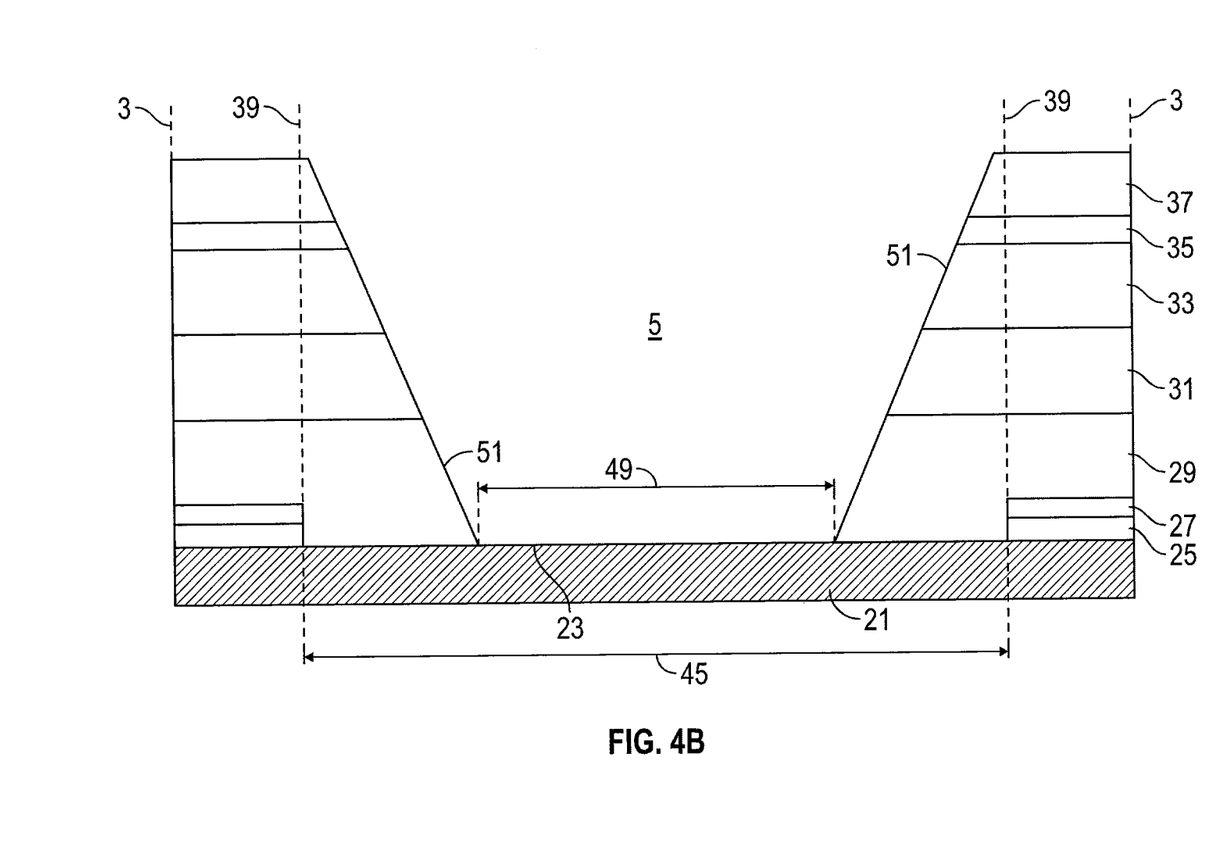

With the photoresist (not shown) in place and serving as a mask, an etching operation is carried out to form deep trench opening 5 such as shown in FIG. 4B. Deep trench opening 5 extends completely through passivation layer 37 and each of dielectric layers 35, 33, 31 and 29, exposing surface 23 of substrate 21. Deep trench opening 5 may be formed by a single continuous etching operation that successively etches through the passivation layer then each of the dielectric layers terminating at surface 23. After the etching operation is concluded, the photoresist is removed using a stripping operation followed by one or more cleaning operations as will be described in further detail infra. Deep trench opening 5 include sidewalls 51 which are shown as being significantly sloped in the illustrated embodiment. Deep trench opening 5 may exhibit various degrees of taper in other exemplary embodiments. Bottom width 49 may represent a percentage of width 45 and may range from about 75% to substantially 100% of width 45 depending on the amount of taper.

Figure 5A:
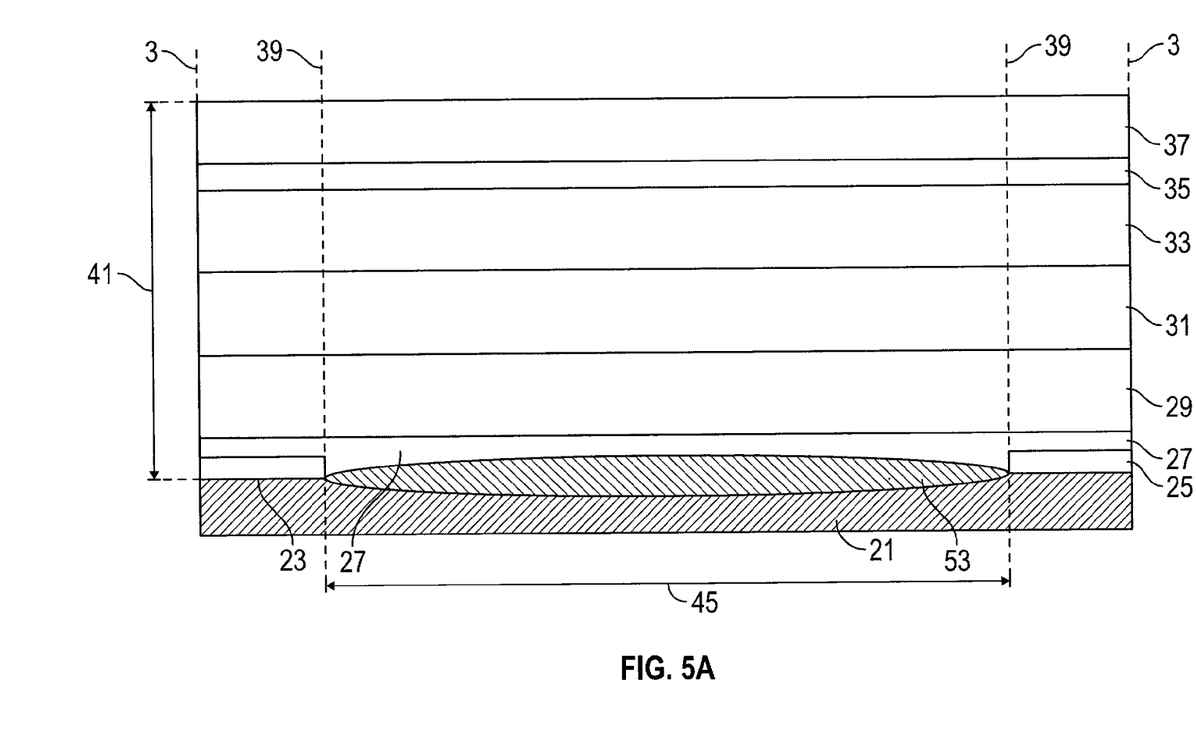
FIGS. 5A-5C are cross-sectional views showing another exemplary sequence of processing operations according to the disclosure.

FIG. 5A shows another exemplary embodiment. It should be understood that like numerals denote like features throughout the specification and drawing. The embodiment shown in FIG. 5A differs from the embodiment shown in FIG. 4A due to the presence of second polysilicon layer 27 extending through region 39 and also due to the presence of field oxide, $F_{OX}$, 53 also formed within region 39.

Figure 5B:
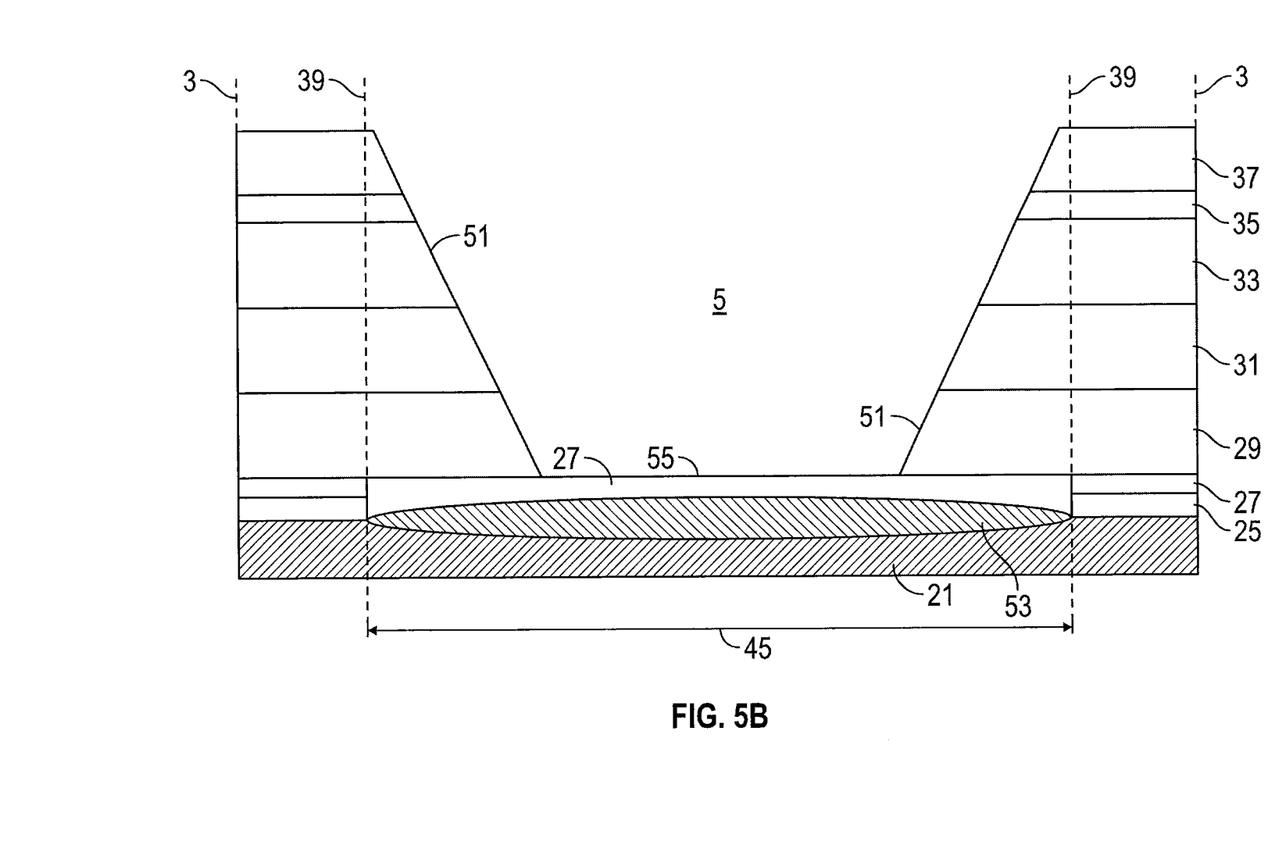

FIG. 5B shows the structure of FIG. 5A after patterning and etching operations have been carried out on the structure shown in FIG. 5A. A photoresist layer is formed on the structure of FIG. 5A except in region 39 and serves as a photomask during an etching operation that etches through passivation layer 37 and dielectric layers 35, 33, 31 and 29, terminating on top surface 55 of second polysilicon layer 27 as shown in FIG. 5B.

Figure 5C:
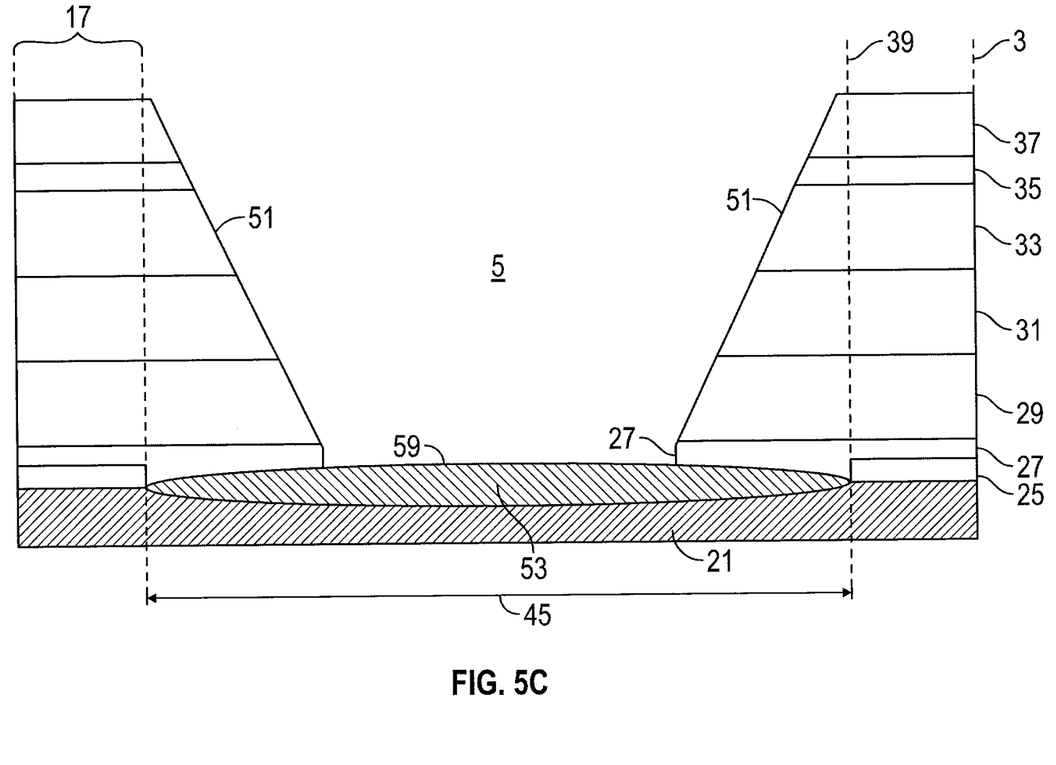

The etching continues through second polysilicon layer 27 within region 39 to produce the structure shown in FIG. 5C. FIG. 5C shows deep trench opening 5, extending through passivation layer 37, dielectric layers 35, 33, 31 and 29, and second polysilicon layer 27 within region 39 thereby exposing upper surface 59 of $F_{OX}$ 53. According to the exemplary embodiment shown in FIGS. 5A-5C, a sequence of etching operations may be used. According to one exemplary embodiment, the sequence of etching operations may include a first etching operation that etches through passivation layer 37 and each of the aforementioned dielectric layers and terminates on second polysilicon layer 27, followed by a second etching operation that etches through second polysilicon layer 27.

Sloped sidewalls 51 are illustrated in exaggerated condition in FIG. 5C in order to show this aspect of the disclosure, and according to other exemplary embodiments, sidewalls 51 may be close to or substantially vertical.

After the succession of etching operations has been completed, the photoresist film may be removed using a conventional dry resist stripping operation which may be followed by one or more subsequent cleaning operations to produce the cleaned, defect-free structure shown in FIG. 5C. According to one exemplary embodiment, a dry resist stripping operation may be followed by a wet stripping/cleaning operation followed by a second dry resist stripping operation. The combination of cleaning operations is intended to be exemplary only.

Figure 6:
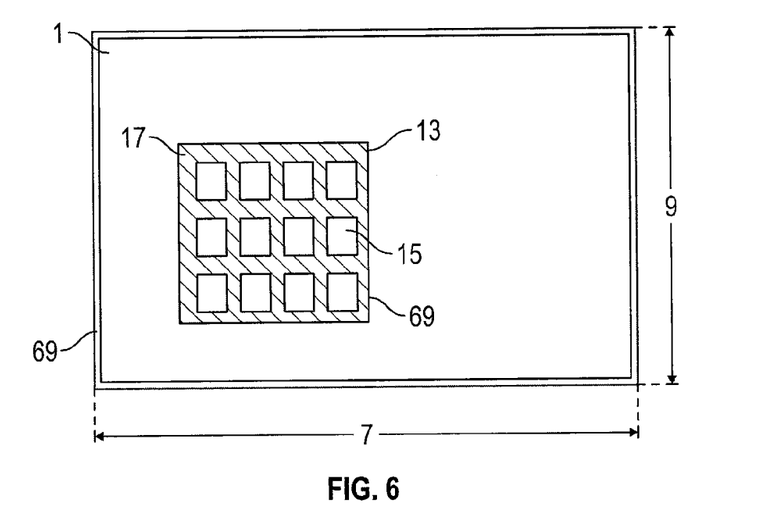
FIG. 6 is a plan view illustrating a seal ring feature formed according to the disclosure.

FIG. 6 is a plan view illustrating another aspect of a feature formed according to the invention. FIG. 6 shows semiconductor chip 1 with blank area 13 and an array of deep trench openings 15 as previously described. Seal ring 69 surrounds blank area 13 and also semiconductor chip 1. Dummy area 17 is also shown and represents regions within blank area 3 that are not etched to form deep trench openings as previously illustrated. Dummy area 17 is also identified in FIG. 5C and includes each of dielectric layers 29, 31, 33, and 35 as well as passivation layer 37 and first polysilicon layer 25 and second polysilicon layer 27. According to other exemplary embodiments, dummy area 17 may include additional features, including, but not limited to other semiconductor materials and interconnect materials. The various components of dummy area 17 may be patterned and processed along with features on other portions of semiconductor chip 1 to provide pattern uniformity which is beneficial in planarization processes.

Figure 7:
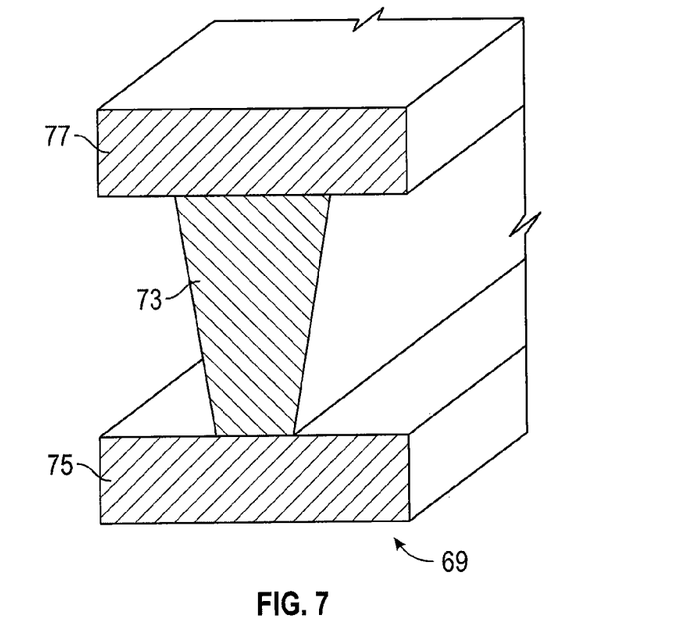
FIG. 7 is a perspective view of a seal ring advantageously formed according to a method of the disclosure.

In one exemplary embodiment, seal ring 69 may include plug material 73 disposed between lower conductor 75 and upper conductor 77 as shown in FIG. 7. Upper conductor 77 and lower conductor 75 may be formed of copper, aluminum or other suitable conductive interconnect materials and plug material 73 may be tungsten, W, which is known to reduce the effects of humidity on semiconductor devices, or other suitable plug materials used in the semiconductor manufacturing industry. Seal ring 69 may be fabricated using the sequence of processing operations used to form semiconductor chip 1, which typically includes multiple layers of conductive interconnect material which are coupled using tungsten or other suitable plugs such as formed using damascene technology. Additional materials or processing operations are not required as seal ring 69 is formed using the formation and patterning operations for forming lower conductor 75, plug material 73 and upper conductor 77 in other areas of semiconductor chip 1. Seal ring 69 surrounds semiconductor chip 1 and blank area 13 and may serve to hermetically seal a further component coupled to semiconductor chip 1 at one or more of the deep trench opening sites.

According to one aspect, the disclosure provides a method for forming a semiconductor chip with a void area exposing a substrate. The method comprises providing a semiconductor substrate comprising a plurality of product chips, each product chip having multiple semiconductor structures and multiple interconnect structures thereon and including a plurality of material layers including an uppermost passivation layer. The method further comprises defining a blank area on at least one product chip, processing the passivation layer through at least a pattern definition operation, a passivation layer etching operation and a photoresist stripping operation and, afterward, forming at least one opening that extends through the plurality of material layers including the uppermost passivation layer and terminates on the surface of the semiconductor substrate in the blank area.

According to another aspect, provided is a method for forming a semiconductor chip with a void area, the method comprising providing a semiconductor substrate comprising a plurality of product chips, each product chip having multiple semiconductor structures and multiple interconnect structures thereon and including a plurality of material layers including an uppermost passivation layer. The method further comprises defining a blank area on at least one product chip, processing the passivation layer through at least a pattern definition operation, a passivation layer etching operation and a photoresist stripping operation, and, after processing the passivation layer, forming at least one opening that extends through the plurality of material layers including the uppermost passivation layer and terminates on an exposed surface. The exposed surface is a field oxide layer disposed directly on the surface of the semiconductor substrate in the blank area and the at least one opening includes an area that is at about 5-10% of an area of the product chip.

According to a further aspect, a method for forming a semiconductor chip with a void area exposing a substrate is provided. The method comprises providing a plurality of chips on a silicon substrate, each chip having multiple semiconductor devices thereon and multiple interconnect structures thereon and including a plurality of material layers including an uppermost nitride passivation layer. The method further comprises defining only a single blank area on at least one chip, and processing the passivation layer through pattern definition, passivation etching and photoresist stripping operations. After processing the passivation layer, the method further provides coating the silicon substrate with a photoresist, patterning the photoresist with a deep trench pattern then performing a deep trench etching operation that forms at least one opening only in the blank area. The at least one opening terminates at an exposed surface of the silicon substrate.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A method for forming a semiconductor chip with a void area exposing a substrate, said method comprising:
   providing a semiconductor substrate comprising a plurality of product chips, each said product chip having multiple semiconductor structures and multiple interconnect structures thereon and including a plurality of material layers including an uppermost passivation layer;
   defining a blank area on at least one said product chip;
   processing said passivation layer through at least a pattern definition operation, a passivation layer etching operation and a photoresist stripping operation; and
   after said processing, forming at least one opening that extends through said plurality of material layers including said uppermost passivation layer, and terminates on a surface of said semiconductor substrate in said blank area.

2. The method as in claim 1, wherein said processing said passivation layer comprises processing said passivation layer through said passivation layer etching operation only in areas other than said blank area.

3. The method as in claim 1, wherein said forming at least one opening comprises forming an array of said openings, each opening having an area of at least 40 microns×40 microns.

4. The method as in claim 3, wherein said forming at least one opening comprises coating with photoresist, forming a deep trench pattern in said photoresist then performing a continuous deep trench etching operation that etches through said plurality of material layers.

5. The method as in claim 3, wherein said openings of said array of openings are separated by dummy portions that include at least some of said semiconductor structures and said interconnect structures therein.

6. The method as in claim 1, wherein said defining a blank area comprises defining only one said blank area and said forming at least one opening comprises forming a single circular opening having a diameter of about 200 microns.

7. The method as in claim 1, wherein said forming at least one opening comprises forming a single opening having an area of about 300 microns×300 microns.

8. The method as in claim 7, wherein said forming at least one opening comprises coating with photoresist, forming a deep trench pattern in said photoresist then performing a deep trench etching operation that etches through said plurality of material layers.

9. The method as in claim 1, wherein said forming at least one opening comprises coating with photoresist, forming a deep trench pattern in said photoresist then performing a deep trench etching operation that etches through said plurality of material layers and exposes said surface.

10. The method as in claim 9, wherein said deep trench etching operation comprises a single etching operation and said plurality of material layers includes an aggregate thickness of about 9 microns.

11. The method as in claim 1, wherein said plurality of material layers includes an aggregate thickness of about 9 microns.

12. The method as in claim 1, wherein said plurality of material layers comprises a plurality of dielectric layers.

13. The method as in claim 1, further comprising forming a seal ring surrounding said blank area, said seal ring including a tungsten lead disposed over a conductive lead and having a further conductive lead disposed thereon.

14. The method as in claim 1, wherein said defining a blank area comprises one blank area comprising at least about 10% of an area of said product chip and wherein said product chips comprise application specific integrated circuits.

15. The method as in claim 1, wherein said blank area includes at least dielectric materials and is void of active semiconductor devices.

16. The method as in claim 1, wherein said plurality of material layers comprises a plurality of dielectric layers disposed over a polysilicon layer and said forming at least one opening comprises coating with photoresist, forming a deep trench pattern in said photoresist then etching through said plurality of material layers using a sequence of etch operations including a single dielectric etch operation followed by a polysilicon etch operation.

17. The method as in claim 16, wherein said processing said passivation layer comprises processing said passivation layer through said passivation layer operation only in areas other than said blank area.

18. A method for forming a semiconductor chip with a void area exposing a substrate, said method comprising:
   providing a plurality of chips on a silicon substrate, each chip having multiple semiconductor devices thereon and multiple interconnect structures thereon and including a plurality of material layers including an uppermost nitride passivation layer;
   defining only a single blank area on at least one said chip;
   processing said passivation layer through pattern definition, passivation etching and photoresist stripping operations in areas other than said single blank area;
   after said processing, coating said silicon substrate with a photoresist; patterning said photoresist with a deep trench pattern then performing a deep trench etching operation that forms at least one opening only in said blank area;
   said at least one opening terminating at an exposed surface of said silicon substrate.

19. The method as in claim 18, wherein said performing a deep trench etching operation comprises performing a single etching operation that etches through materials having an aggregate thickness of about 9 microns.

* * * * *